United States Patent
Ma et al.

(10) Patent No.: US 7,395,521 B1
(45) Date of Patent: Jul. 1, 2008

(54) METHOD AND APPARATUS FOR TRANSLATING AN IMPERATIVE PROGRAMMING LANGUAGE DESCRIPTION OF A CIRCUIT INTO A HARDWARE DESCRIPTION

(75) Inventors: Haibing Ma, Superior, CO (US); Roger B. Milne, Boulder, CO (US)

(73) Assignee: Xilinx, Inc., San Jose, CA (US)

( * ) Notice: Subject to any disclaimer, the term of this patent is extended or adjusted under 35 U.S.C. 154(b) by 318 days.

(21) Appl. No.: 11/250,942

(22) Filed: Oct. 14, 2005

(51) Int. Cl.
*G06F 17/50* (2006.01)
(52) U.S. Cl. .............................................. 716/18; 716/3
(58) Field of Classification Search ................. None
See application file for complete search history.

(56) References Cited

U.S. PATENT DOCUMENTS

| | | | |
|---|---|---|---|
| 6,226,776 B1 * | 5/2001 | Panchul et al. ................. 716/3 |
| 6,701,501 B2 * | 3/2004 | Waters et al. .................. 716/8 |
| 6,877,150 B1 * | 4/2005 | Miller et al. .................. 716/18 |
| 7,000,213 B2 * | 2/2006 | Banerjee et al. ............... 716/18 |
| 7,062,728 B2 * | 6/2006 | Tojima ........................... 716/3 |
| 7,143,388 B1 * | 11/2006 | Miller et al. .................. 716/18 |
| 7,146,581 B2 * | 12/2006 | Klein ............................ 716/2 |
| 7,203,912 B2 * | 4/2007 | Moona et al. .................. 716/3 |

OTHER PUBLICATIONS

U.S. Appl. No. 11/101,075, filed Apr. 7, 2005, Ma et al.

* cited by examiner

*Primary Examiner*—Leigh Marie Garbowski
(74) *Attorney, Agent, or Firm*—Robert M. Brush

(57) ABSTRACT

Method and apparatus for translating an imperative programming language description of a circuit into a hardware description is described. In one example, a state object in a function of the imperative programming language description is identified. Use of the state object in the function is compared against criteria associated with each of a plurality of hardware objects. The state object is mapped to a hardware object of the plurality of hardware objects such that the use of the state object in the function satisfies the criteria of the hardware object. At least one instance of the hardware object is generated in the hardware description.

20 Claims, 8 Drawing Sheets

METHOD AND APPARATUS FOR TRANSLATING AN IMPERATIVE PROGRAMMING LANGUAGE DESCRIPTION OF A CIRCUIT INTO A HARDWARE DESCRIPTION

FIELD OF THE INVENTION

One or more aspects of the present invention relate generally to computer-aided circuit design and, more particularly, to a method and apparatus for translating an imperative programming language description of a circuit into a hardware description.

BACKGROUND OF THE INVENTION

Hardware description languages (HDLs) exist that can be used to provide a hardware description of a circuit. Exemplary HDLs include the Very high-speed integrated circuit Hardware Description Language (VHDL) and VERILOG. After a designer specifies a circuit in HDL, the HDL hardware description may be readily implemented as hardware, such as an integrated circuit, using a standard implementation design flow. For example, the HDL description can be synthesized to gate-level abstraction, mapped, placed, and routed for a programmable logic device (PLD), such as a field programmable gate array (FPGA).

Presently, there is considerable interest in specifying a circuit using an imperative programming language description. Exemplary programming languages include C, C++, JAVA, MATLAB scripting language, and the like. Since standard implementation tools that process an HDL description into hardware are readily available, it is desirable to translate a programming language description of a circuit into a hardware description, such as an HDL description. Accordingly, there exists a need in the art for a method and apparatus that allows a designer to design a circuit in software fashion and have a tool map software objects to appropriate hardware components for instantiation in a hardware description, such as an HDL description.

SUMMARY OF THE INVENTION

Method and apparatus for translating an imperative programming language description of a circuit into a hardware description is described. In one embodiment, a state object in a function of the imperative programming language description is identified. Use of the state object in the function is compared against criteria associated with each of a plurality of hardware objects. The state object is mapped to a hardware object of the plurality of hardware objects such that the use of the state object in the function satisfies the criteria of the hardware object. At least one instance of the hardware object is generated in the hardware description.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

Figure 1:
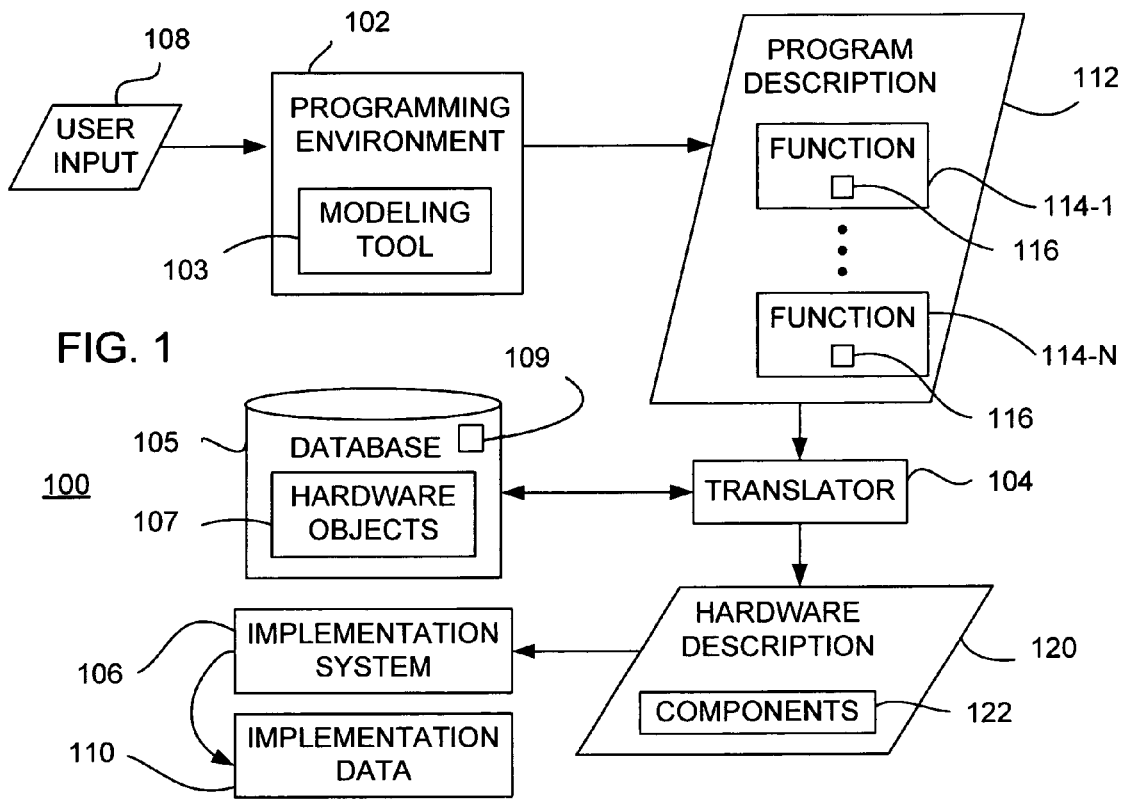
FIG. 1 is a block diagram depicting an exemplary embodiment of a circuit design system constructed in accordance with one or more aspects of the invention.

FIG. 1 is a block diagram depicting an exemplary embodiment of a circuit design system 100 constructed in accordance with one or more aspects of the invention. The system 100 comprises a programming environment 102, a translator 104, and an implementation system 106. The system 100 is configured to process user input 108 and produce circuit implementation data 110. For example, the system 100 may produce implementation data for a programmable logic device (PLD), such as a field programmable gate array (FPGA), a mask-programmable device, such as an application specific integrated circuit (ASIC), or like type integrated circuit devices.

In particular, the programming environment 102 is configured to receive the user input 108. Through the user input 108, the programming environment 102 generates a program description 112 of a circuit. The program description 112 is defined using an imperative programming language, such as C, C++, JAVA, MATLAB scripting language, and like type imperative programming languages known in the art. The programming environment 102 includes a modeling tool 103. The modeling tool 103 provides for cycle-based simulation of the circuit described by the program description. Examples of such modeling tools include MATLAB and SIMULINK, commercially available from Mathworks, Inc. of Natick, Mass., as well as SYSTEM GENERATOR, commercially available from Xilinx, Inc. of San Jose, Calif.

The program description 112 includes a program that calls one or more functions 114-1 through 114-N (collectively functions 114), where N is an integer greater than zero. The program description 112 is executed in an environment created by the modeling tool 103 such that the program is executed once per simulation cycle. During execution of the program, each of the functions 114 is called one or more times in each simulation cycle (i.e., there are one or more instances of a given function per simulation cycle). Each of instance of a function in a given simulation cycle corresponds to a subsystem in the modeling tool 103 and, as described below, is mapped into a subsystem in hardware by the translator 104.

Each of the functions 114 includes one or more state objects ("state object(s) 116"). For a given function, the state objects 116 model internal states of circuit components. For example, a function mappable to register in hardware includes a state object associated with the value stored in the register. By "mappable", it is meant that the translator 104 will analyze the semantics of the function, in particular the state objects of the function, and determine that the function can be mapped to a particular subsystem or hardware component, such as a register. Since a state object models an internal state, the state of the state object is persistent across executions of the function from simulation cycle to simulation cycle. In one embodiment, the state objects 116 are implemented using persistent variables, as defined in the language of the program description 112. Examples of persistent variables include persistent variables in MATLAB, class members in object-oriented languages (e.g., C++, JAVA), and static variables in C.

In addition, the program description 112 may be configured such that a function is called more than once in a given simulation cycle (i.e., multiple intra-cycle function calls). In terms of hardware, such a function models more than one instance of a subsystem. Thus, a state object is initialized in a function based on its calling point in the program description 112. In one embodiment, each state object is initialized in a function using an initialization function, the return value of which initializes the state of the state object. The initialization function is configured to maintain separate sets of states for a given state object for separate intra-cycle function calls. In one embodiment, the initialization function maintains different states for the state objects 116 in a table. For a given call to a function, an initial state for each state object is selected based on the call path to the function in the program description 112. The initialization function obtains the call path from the runtime call stack accessible in the programming environment 102. As is well known in the art, the runtime call stack provides a call path to the current execution point in a program. An exemplary initialization function and process that may be used is described in commonly-assigned U.S. patent application Ser. No. 11/101,075, filed Apr. 7, 2005, entitled "Method and Apparatus for Modeling Multiple Instances of an Electronic Circuit Using an Imperative Programming Language Description," by Roger B. Milne and Haibing Ma.

In one embodiment, each of the state objects comprises either a scalar state object or a vector state object. A scalar state object holds a single data item and is initialized with the initialization function. A scalar state object has two operations: getting the state and setting the state. Setting the state is accomplished by putting the state object at the left hand side of an assignment operation. Getting the state is accomplished by referencing the state object in an expression. An exemplary use of a scalar state object is:

function q=xlreg(d)
persistent s; % s is declared as a persistent variable
s=xl_state(0, d); % initialized with 0 and d's precision
q=s; % get the state
s=d; % set the state to be d For purposes of clarity, examples of code included herein are expressed using MATLAB scripting code. In the above example (as well as the examples below), the function "xl_state" is the initialization function described above. The exemplary xl_Estate function receives two arguments: an initial value (e.g., zero) and a precision. The xl_state function returns a state for the state object, s.

A vector sate object holds an array of data items and is initialized with the initialization function. An exemplary initialization function receives an initial vector, a maximum length, and a data precision as arguments. For example, obj=xl_state([0,0,0,0], {xlSigned,8,4},8) creates a vector state object, obj, which as an initial state of [0,0,0,0], a precision of a signed fixed number 8-bits wide with binary point at bit 4, and a maximum length of 8. A vector state object includes the following operations.

(1) Obj.front( ): gets the first element of vector obj;

(2) Obj.back( ): gets the last element of vector obj;

(3) Obj.length( ): gets the number of elements of vector obj;

(4) Obj.maxlen( ): gets the maximum number of elements vector obj can store;

(5) Obj(n): gets the n-th element of the vector;

(6) Obj.push_front(d): pushes d to the front end of the vector (the vector length is increased by one);

(7) Obj.push_back(d): pushes d to the back end of the vector (the vector length is increased by one);

(8) Obj.pop_back( ): removes the last element of vector obj;

(9) Obj.push_front_pop_back(d): shifts d into the front end of the vector, shifting each value towards the back and losing the back value (the vector length is unchanged);

(10) Obj.push_back_pop_front(d): shifts d into the back end of the vector, shifting each value towards the front and losing the front value (the vector length is unchanged); and

(11) Qbj(n)=d: sets the n-th element of the vector to have value d.

The usage of maxlen is important in defining those sate objects that are intended to described hardware. This is in contrast to corresponding objects in widespread use for the creation of software, in which object sizes are allowed to grow arbitrarily.

The translator 104 is configured to receive the program description 112. The translator 104 processes the program description 112 to produce a hardware description 120. The hardware description 120 may comprise one or more of an abstract description of the circuit, such as a schematic representation having blocks representing electronic components and nets representing connections between components, an HDL representation, and a low level netlist description (i.e., a gate-level netlist). In any case, the hardware description 120 includes circuit components and subsystems (generally referred to as components 122) configured in accordance with the program description 112. In particular, the translator 104 maps each of the functions 114 (software objects) into one or more hardware objects. The hardware description is generated by instantiating the hardware object(s) for each instance of the mapped function called during a simulation cycle.

The translator 104 is coupled to a database 105. The database 105 stores the various types of hardware objects (hardware objects 107) that can be instantiated in the hardware description 120. For example, the hardware objects 107 may include various types of hardware components having an internal state, such as a register, a shift register, a tapped shift register line, a register bank, an addressable shift register, a read only memory (ROM), a single port random access memory (RAM), a dual port RAM, a first-in-first-out circuit (FIFO), and like type logic circuits known in the art. The hardware objects 107 also include various types of combinatorial logic elements (e.g., logic gates, multiplexers, and the like). For a given function, the translator 104 identifies each state object therein as either a scalar state object or a vector state object. A vector state object is mappable to one of the hardware objects 107 if the manner in which the state object is used in the function satisfies criteria associated with the hardware object.

Notably, the database 105 stores criteria for each of the hardware objects 107 having an internal state (collectively criteria 109). The criteria associated with mapping a vector state object to a given hardware object may include: (1) rules associated with the types of operations that may be performed on the state object; (2) rules associated with the sequence of operations performed on the state object within the function; and (3) rules associated with the number of times a given operation is performed on the state object. The criteria may include other rules, as discussed in the example mappings below.

The criteria associated with mapping a scalar state object to a given hardware object is as follows: Typically, the translator 104 maps a scalar state object to a register hardware object.

This is the default mapping of a scalar state object. In some cases, a scalar state object may not be mapped to a register. For example, the scalar state object may be mapped to a port of a memory to which another vector state object is mappable. In such a case, the scalar state object is mapped together with the vector state object into a memory hardware object having a latency of one cycle. Such a mapping may be understood with reference to the example mappings below.

The translator 104 is also configured to map one or more expressions in a given function to combinatorial logic. For example, conditional statements may be mapped to multiplexer logic. An exemplary process for translating an imperative programming language description of a circuit into a hardware description is described below with respect to FIG. 2.

After mapping each of the functions 114 into one or more hardware objects, the translator 104 generates an instance of the hardware object(s) for each instance of a mapped function in the hardware description 120. The implementation system 106 is configured to receive the hardware description 120. The implementation system 106 processes the hardware description 120 using a standard design flow for an integrated circuit to produce the implementation data 110. For example, for an FPGA, the implementation system 106 performs the steps of synthesis, technology mapping, placing and routing, and bitstream generation. Implementation flows for other types of integrated circuits are well known in the art and thus omitted for clarity.

Figure 2:
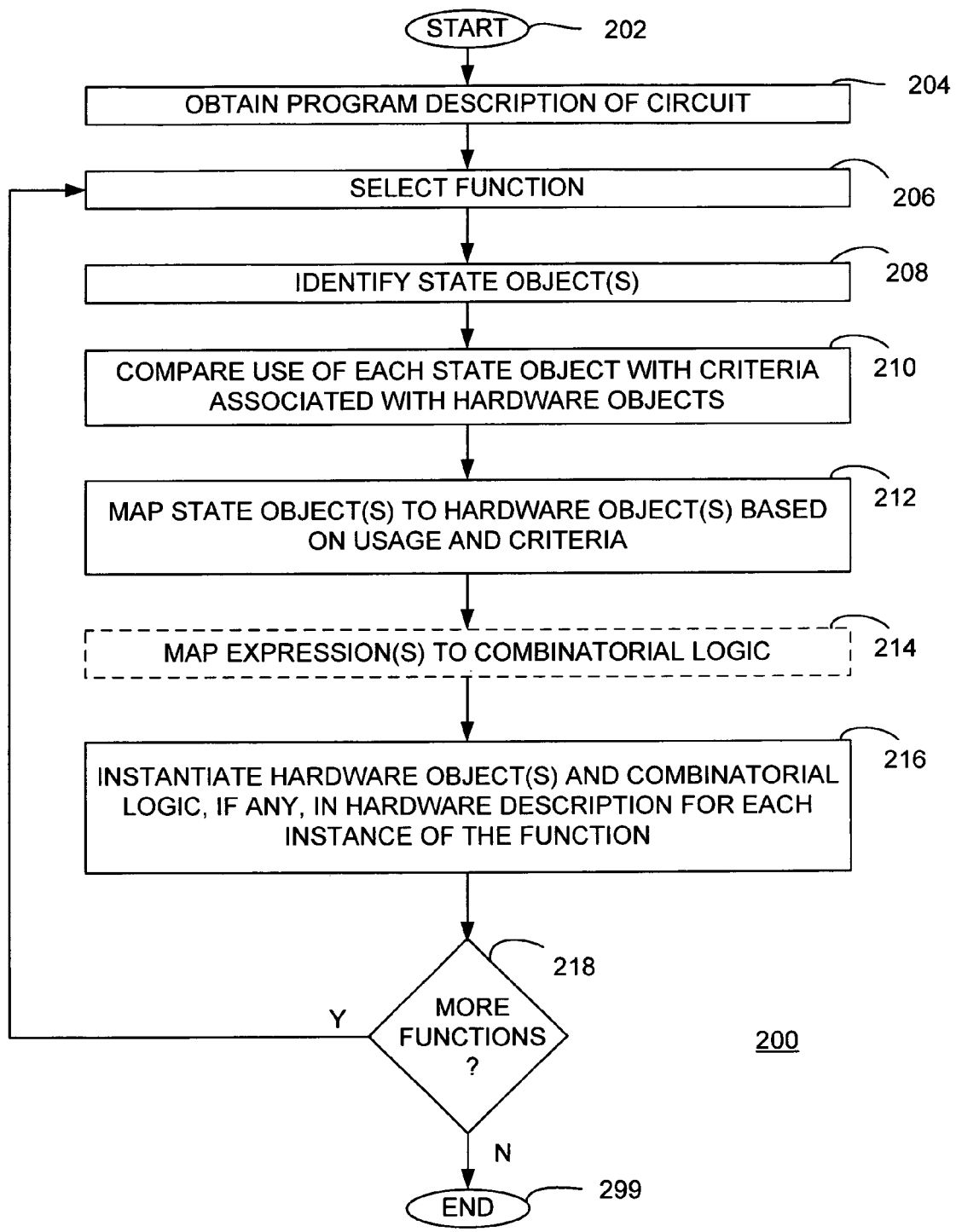
FIG. 2 is a flow diagram depicting an exemplary embodiment of a method for translating an imperative programming language description of a circuit into a hardware description in accordance with one or more aspects of the invention.

FIG. 2 is a flow diagram depicting an exemplary embodiment of a method 200 for translating an imperative programming language description of a circuit into a hardware description in accordance with one or more aspects of the invention. The method 200 begins at step 202. At step 204, a program description of the circuit is obtained. At step 206, a function is selected from the program description. At step 208, one or more state objects in the function are identified. At step 210, the use of each state object in the function is compared against criteria associated with each of a plurality of hardware objects. At step 212, the state object(s) is/are mapped to hardware object(s) based on the usage of the state object(s) and the criteria of the hardware object(s). At optional step 214, at least one expression in the function is mapped to combinatorial logic. At step 216, the hardware object(s) and the combinatorial logic, if any, is instantiated in the hardware description for each instance of the function in the program description. At step 218, a determination is made whether the program description includes more functions. If so, the method 200 returns to step 206 and repeats. Otherwise, the method 200 ends at step 299.

Figure 3:
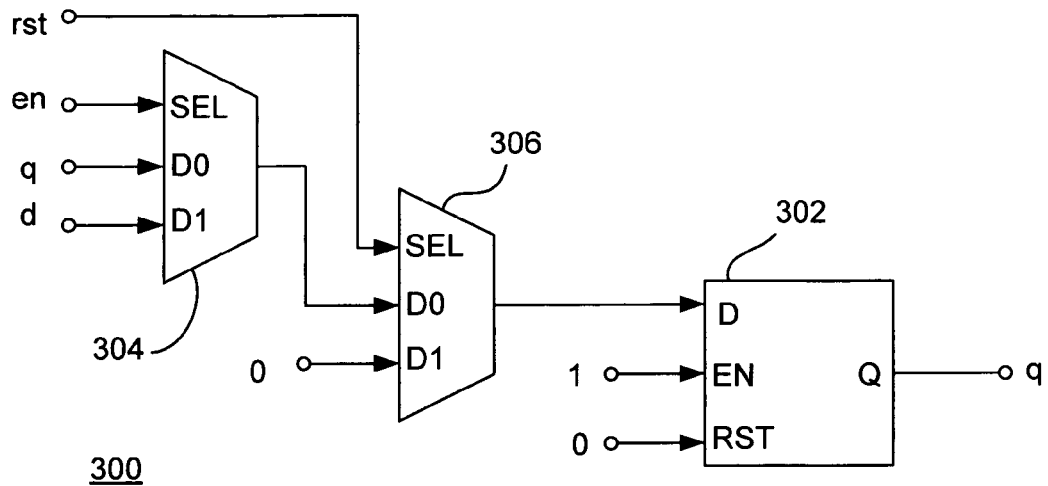
FIGS. 3-11 are block diagrams of exemplary hardware objects to which software objects may be mapped.

The process of mapping software objects to hardware objects performed by the translator 104 may be understood with reference to the following examples. A first example considers a hardware register. A register typically includes a clock port (CLK), a clock enable port (CE), a data-in port (D), a data-out port (Q), a reset port (RST), and an enable port (EN). A scalar state object is mappable to a register. The state of the scalar state object when the simulation just enters the function (the state retained from the last simulation cycle) is mapped to the Q port of the register. The state of the scalar state object when the simulation is about to exit the function is mapped to the D port of the register. The CLK and CE ports are tied to the clock and clock enable pair for the sub-system mapped to the function. The RST port is tied to low (inactive) and the EN port is tied to high (active). For example, the following function is mappable to a register:
 function q=xlreg(rst, en, d)
 persistent reg; reg=xl_state(0, d);
 % initialized with 0 and d's precision
 % the reg value seen here maps to the Q port
 q=reg; % get the value
 if rst
  reg=0;
 elseif en
  reg=d;
 end FIG. 3 is a block diagram illustrating a subsystem 300 corresponding to the xlreg function without optimization. The subsystem 300 includes a register 302, a multiplexer 304, and a multiplexer 306. The register 302 includes a D port, a RST port, an EN port, and a Q port. Each of the multiplexers 304 and 306 includes a selection port SEL and data ports D0 and D1. The D0 and D1 ports of the multiplexer 304 receive signals associated with the q and d variables, respectively. The SEL port of the multiplexer 304 receives a signal associated with the en variable. The D0 and D1 ports of the multiplexer 306 are coupled to an output of the multiplexer 304 and a constant logic low (inactive). The SEL port of the multiplexer 306 receives a signal associated with the rst variable. The D port of the register 302 is coupled to an output of the multiplexer 306, the RST port of the register 302 receives a constant logic low, and the EN port of the register 302 receives a constant logic high (active). Notably, the scalar state object reg is mapped to the register 302. The conditional if and elseif expressions are mapped to multiplexers 304 and 306. For purposes of clarity by example, the subsystem 300, as well some of the exemplary subsystems described below, is shown without optimizations. Those skilled in the art will appreciate that the hardware mappings produced by the invention may be optimized in a well known manner once produced.

Another example considers a shift register. A shift register is a chain of single registers in which the output of a register is connected to the input of the next register in the chain. The number of stages (registers) in the chain is known as the depth of the shift register. A shift register includes a CLK port, a D port, an EN port, and a Q port. A vector state object may be mapped to a shift register hardware object if the usage of the vector state object meets the following criteria:
 (1) The only operations for that object are obj.back( ) and obj.push_front_pop_back(d);
 (2) The calls to obj.back( ) precede the call to obj.push_front_pop_back(d); and
 (3) For any simulation cycle, at most one obj.push_front_pop_back(d) is called.

In the following function, the vector state object can be mapped to a shift register, since its usage meets the above criteria:
 function q=xlshift2(sel, d1, d2)
 persistent obj; obj=xl_state([0,0,0,0], d, 4);
 q=obj.back( );
 switch sel
  case 0
   obj.push_front_pop_back(d1);
  case 1
   obj_push_front_pop_back(d2);
 end In the function xlshift2, although syntactically there are two calls of obj.push_front_pop_back( ), semantically, only one is called during an execution of the function. The rule of mapping is that whenever there is an obj.push_front_pop_back(data_to_push), the D port of the shift register is set to be the data_to_push and the EN port of the shift register is set to high.

Figure 4:
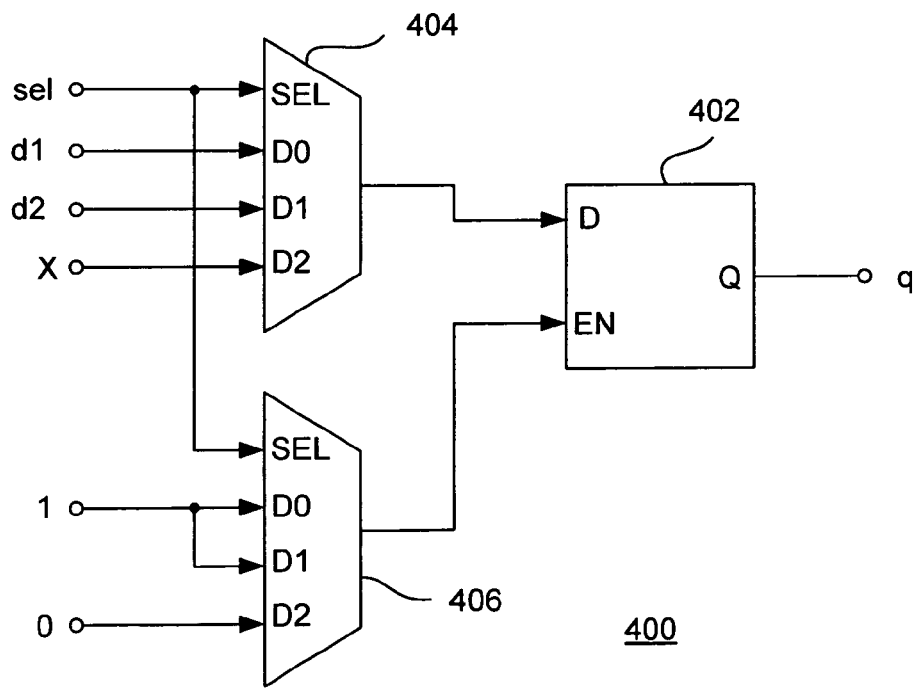

FIG. 4 is a block diagram illustrating a subsystem 400 corresponding to the xlshift2 function without optimization. The subsystem 400 comprises a shift register 402, a multiplexer 404, and a multiplexer 406. The shift register 402 has a depth of four and includes a D port, an EN port, and a Q port. Each of the multiplexers 404 and 406 include a selection port SEL and data input ports D0, D1, and D1. The D2 port of the multiplexer 404 receives a "don't care" value (either logic high or low) and the D0 and D1 ports receive signals associated with the d1 and d2 variables, respectively. The SEL port of the multiplexer 404 receives a signal associated with the sel variable. The D0 and D1 ports of the multiplexer 406 receive constant logic high values, and the D2 port of the multiplexer 406 receives a constant logic low value. The SEL port of the multiplexer 406 receives the signal associated with the sel variable. The D port of the shift register 402 is coupled to an output of the multiplexer 404, and the EN port of the shift register 402 is coupled to an output of the multiplexer 406. Notably, the vector state object obj is mapped to the shift register 402. The conditional switch expression is mapped to multiplexers 404 and 406.

Another example considers a tapped shift register line. The tapped shift register line is a register chain similar to a shift register except that each register value is accessible. A vector state object can be mapped to a tapped shift register line hardware object if the usage of the vector state object meets the following criteria:
(1) The only operations for that object are obj.push_front_pop_back(d) and obj(addr);
(2) The calls to obj(addr) precede the call to obj.push_front_pop_back(d);
(3) All calls to obj(addr) must have addr values determined during compile time (as opposed to dynamically during runtime); and
(4) For any simulation cycle, there is at most one call to obj.push_front_pop_back(d).

Figure 5:
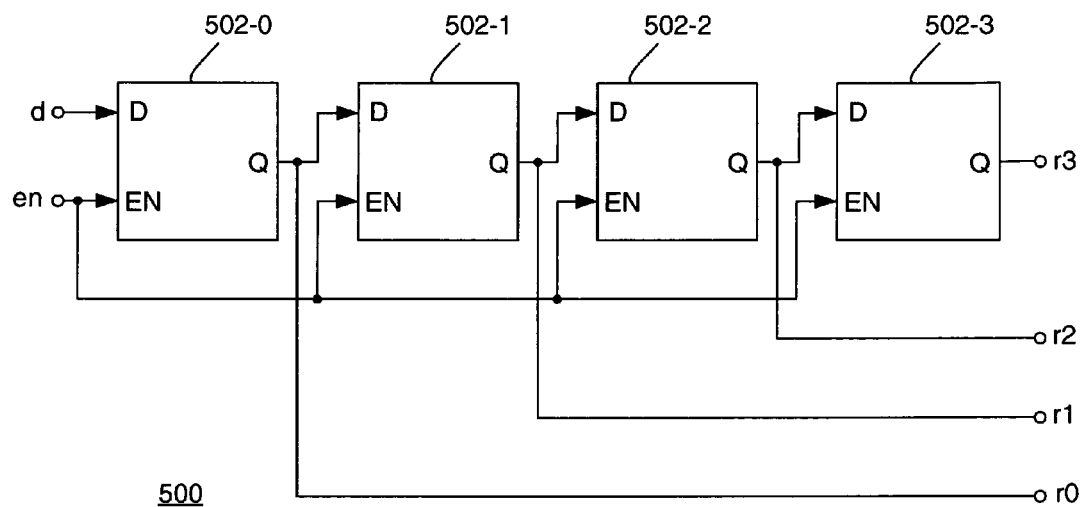

In the following function, the vector state object can be mapped to a shift register, since its usage meets the above criteria:
function [r0, r1, r2, r3]=xltapreg(en, d)
persistent obj; obj=xl_state([0,0,0,0], d, 4);
r0=obj(0);
r1=obj(1);
r2=obj(2);
r3=obj(3);
if en
    obj.push_front_pop_back(d);
end FIG. 5 is a block diagram illustrating a subsystem 500 corresponding to the xitapreg function. The subsystem 500 includes registers 502-0 through 502-3 (collectively referred to as registers 502), each of which includes a D port, an EN port, and a Q port. The D port of the register 502-0 receives a signal associated with the d variable. The EN port of each of the registers 502 receives a signal associated with the en variable. The Q port of the register 502-0 is coupled to the D-port of the register 502-1, the Q port of the register 502-1 is coupled to the D port of the register 502-2, and the Q port of the register 502-2 is coupled to the D port of the register 502-3. The Q ports of the registers 502-0 through 502-3 provide signals associated with the variables r0 through r3, respectively. Notably, the vector state object obj is mapped to the sub-system 500.

Another example considers a register bank, which is a chain of registers with some combinatorial logic feeding the data input ports of the registers. A vector state object can be mapped to a register bank if the object usage meets the following criteria:
(1) The only operations for that object are obj(addr), obj(addr)=d, and obj.push_front_pop_back(d);
(2) All calls to obj(addr) precede the call to obj.push_front_pop_back(d);
(3) All calls to obj(addr) have argument values that are determined during compile time;
(4) For any simulation cycle, there is at most one call to obj.push_front_pop_back(d).

In the following function, the vector state object can be mapped to a register bank, since its usage meets the above criteria:
function q=xlregbank(en, d)
persistent obj; obj=xl_state([0,0,0,0], d, 4);
q=obj(3);
obj(0)=obj(0)+obj(2);
obj(2)=obj(2)−obj(1);
if en
    obj.push_front_pop_back(d);
end To map the xlregbank function to hardware, the following steps are applied:
(1) Convert the vector state object into scalar state objects. Each element of the vector is converted to a scalar state object. For example, a vector obj of length 4 is converted to four scalar state objects obj_0, obj_1, obj_2, and obj_3.
(2) Replace all the calls to obj(n) to obj_n and replace all the expressions obj(n)=d to obj_n=d.
(3) Replace obj.push_front_pop_back(d) with the equivalence of a sequence of scalar state object assignments. For example, obj_3=obj_2, obj_2=obj_1, obj_1=obj_0, obj_0=d.
(4) Do analysis on converted function.

Figure 6:
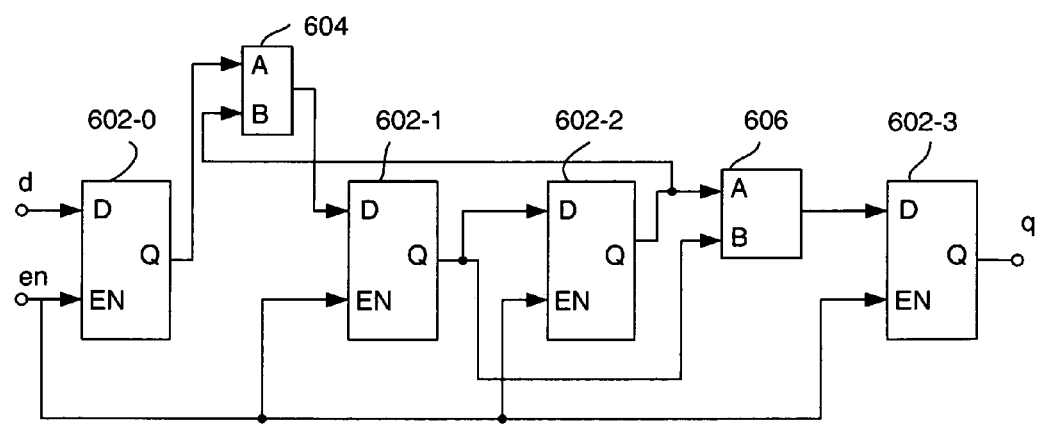

The converted function is as follows:
function q=xlregbank(en, d)
persistent obj_0; obj_0=xl_state(0, d);
persistent obj_1; obj_1=xl_state(0, d);
persistent obj_2; obj_2=xl_state(0, d);
persistent obj_3; obj_3=xl_state(0, d);
q=obj_3;
obj_0=obj_0+obj_2;
obj_2=obj_2−obj_1;
if en
    obj_3=obj_2;
    obj_2=obj_1;
    obj_1=obj_0;
    obj_0=d;
end FIG. 6 is a block diagram illustrating a subsystem 600 corresponding to the xlregbank function. The subsystem 600 includes registers 602-0 through 602-3 (collectively referred to as registers 602), each of which includes a D port, an EN port, and a Q port. The subsystem 600 further includes adder 604 and subtractor 606. The adder 604 includes an A port and a B port and adds the signal at the A port to the signal at the B port (A+B). The subtractor 606 includes an A port and a B port and subtracts the signal at the B port from the signal at the A port (A−B). The adder 604 and the subtractor 606 comprise combinatorial logic. The D port of the register 602-0 receives a signal associated with the d variable. The EN port of each of the registers 602 receives a signal associated with the en variable. The Q port of the register 602-0 is coupled to the A-port of the adder 604. An output port of the adder 604 is coupled to the D port of the register 602-1. The Q port of the register 602-1 is coupled to both the D port of the register 602-2 and the B port of the subtractor 606. The Q port of the register 602-2 is coupled to both the A port of the subtractor 606 and the B port of the adder 604. An output of the subtractor 606 is coupled to the D port of the register 602_3. The Q port of the register 602_2 provides a signal associated with the q variable. Notably, the vector state object obj is mapped to the registers 602 and the addition and subtraction expressions are mapped to the adder 604 and the subtractor 606, respectively.

Another example considers an addressable shift register, which is a variable length shift-register in which any register in the delay chain can be addressed and driven onto the output data port. The addressable shift register has a CLK port, a D port, and EN port, and address port (ADDR), and Q port. A vector state object can be mapped to an addressable shift register in hardware if the usage of the object meets the following criteria:

(1) The only operations for that object are obj(addr) and obj.push_front_pop_back(d);
(2) The call to obj(addr) precedes the call to obj.push_front_pop_back(d);
(3) For any simulation cycle, there is at most one call to obj(addr) and at most one call to obj.push_front_pop_back(d).

In the following function, the vector state object can be mapped to a shift register, since its usage meets the above criteria:

function q=xladdrsr (adr_sel, addr1, addr2, din_sel, d1, d2)
persistent obj; obj=xl_state([0,0,0,0], {xlSigned, 8, 4}, 4);
if adr_sel==0
  q=obj(addr1);
else
  q=obj(addrs);
end
if din_sel==0
  obj.push_front_pop_back(d1);
elseif din_sel==1
  obj.push_front_pop_back(d2);
end In the above function, although syntactically there are two calls of obj(addr) and two calls of obj.push_front_pop_back( ), semantically, at most one obj(addr) is called and at most one obj.push_front_pop_back( ) is called during an execution of the function. The rule used in mapping the function to hardware is that whenever there is an obj.push_front_pop_back (data_to_push), the D port of the addressable shift register should be set to the data_to_push and the EN port of the addressable shift register is set to logic high (active). In addition, whenever there is an obj(addr), the ADDR port of the addressable shift register should be set to the address to read.

Figure 7:
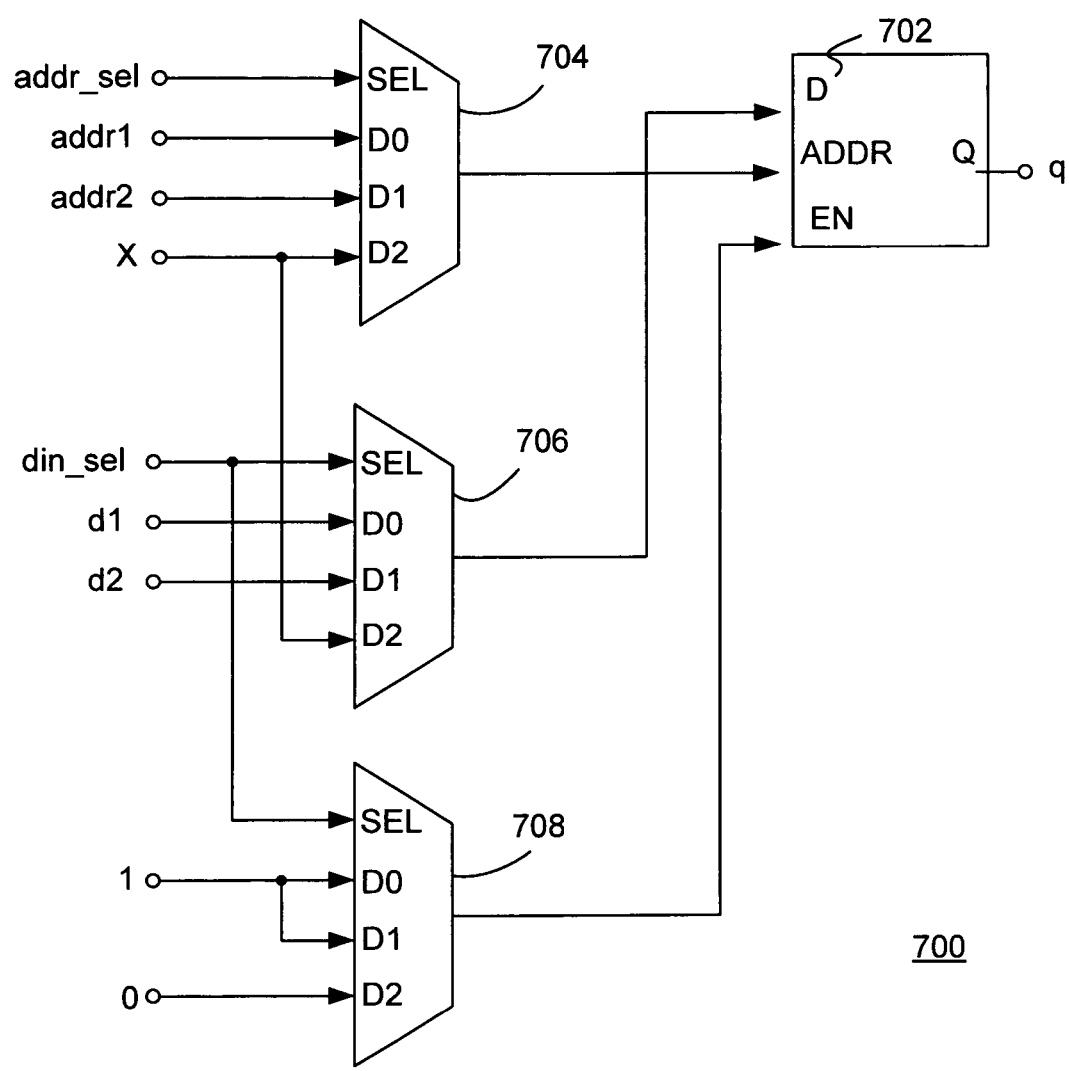

FIG. 7 is a block diagram illustrating a subsystem 700 corresponding to the xladdrsr function. The subsystem 700 includes an addressable shift register 702 and multiplexers 704, 706, and 708. The addressable shift register 702 includes a D port, an ADDR port, and EN port, and a Q port. Each of the multiplexers 704, 706, and 708 include three data ports D0-D2, and a selection port SEL. The SEL port of the multiplexer 704 receives a signal associated with the addr_sel variable. The D0 and D1 ports of the multiplexer 704 receive signals associated with the addr1 and addr2 variables, respectively. The D2 port of the multiplexer 704 receives a "don't care" value. The SEL port of the multiplexer 706 receives a signal associated with the din_sel variable. The D0 and D1 ports of the multiplexer 706 receive signals associated with the variables d1 and d2, respectively. The D2 port of the multiplexer 706 receives the "don't care" value. The SEL port of the multiplexer 708 receives the signal associated with the din_sel variable. The D0 and D1 ports of the multiplexer 708 receive a constant logic high. The D2 port of the multiplexer 708 receives a constant logic low. Output of the multiplexer 704 is coupled to the ADDR port of the addressable shift register 702, output of the multiplexer 706 is coupled to the D port of the addressable shift register 702, and output of the multiplexer 708 is coupled to the EN port of the addressable shift register 702. The Q port of the addressable shift register 702 provides a signal associated with the q variable. Notably, the vector state object obj is mapped to the addressable shift register 702, and the if expressions are mapped to the multiplexers 704, 706, and 708.

Another example considers a single-port ROM. The ROM has one input port for the memory address (ADDR), and one output port for the data out (Q). The ROM has an optional port for CLK if the latency is not zero. A vector state object can be mapped to a ROM in hardware, if the object usage meets the following criteria:

(1) The only operation for that object is obj(addr);
(2) At most one obj(addr) is performed during a cycle or all calls to obj(addr) are detected to have the same address value during compile time;
(3) If the obj(addr) call is feeding the result to an output of some combinatorial logic, the object is mapped to a zero latency ROM;
(4) If the obj(addr) call is feeding only to a scalar state object, the vector state object obj together with the scalar state object are mapped to a one latency ROM.

In the following function, the vector state objects obj1 and obj2 can be mapped to a zero latency ROM, and the vector state object obj3 can be mapped to a one latency ROM, since their usage meets the above criteria:

function [q1, q2, q3, q4]=xlrom (adr_sel, addr1, addr2, offset)
persistent obj1; obj1=xl_state([1, 2, 3, 4], {xlSigned, 8, 4}, 4);
persistent obj2; obj2=xl_state([1, 3, 5, 7], {xlSigned, 8, 4}, 4);
persistent obj3; obj3=xl_state([2, 4, 6, 8], {xlSigned, 8, 4}, 4);
persistent reg; reg=xl_state(0, {xlSigned, 8, 4});
if adr_sel==0
q1=obj1(addr1);
else
q1=obj1(addr2);
end
addr=addr1+offset;
q2=obj2(addr);
q3=obj2(addr1+offset);
q4=reg;
reg=obj3(addr2);

In the above function, for object obj1, there is only one obj1(addr) called for any given cycle. For obj2, although there are two obj2(addr) called, both addresses hold the same value of addr1+offset.

Figure 8:
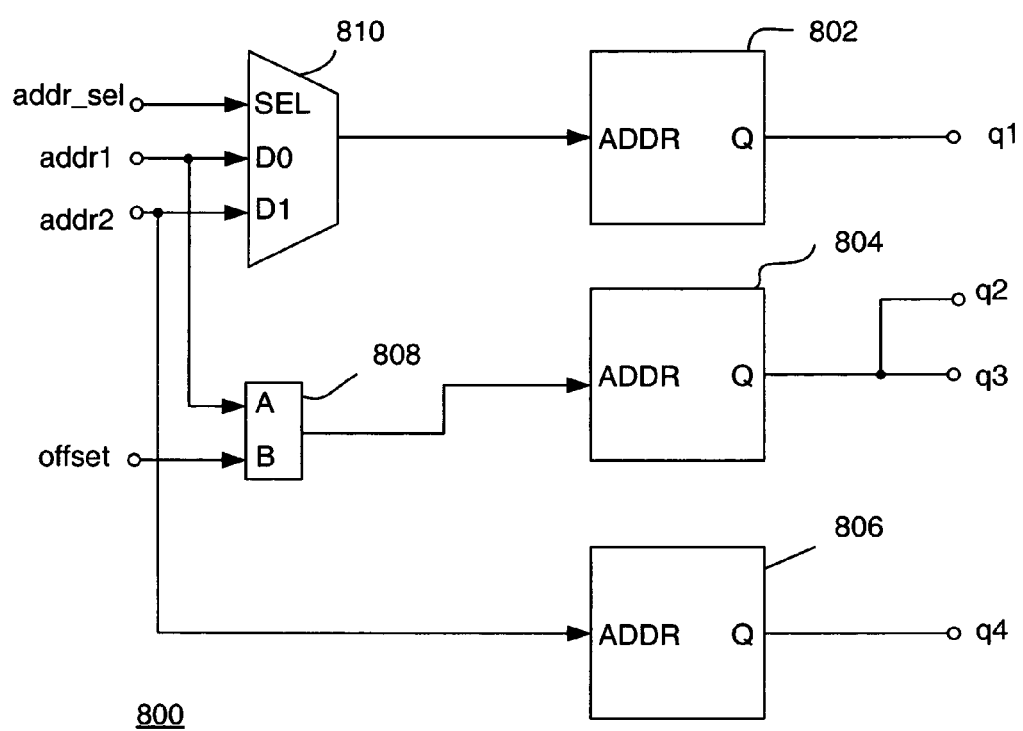

FIG. 8 is a block diagram illustrating a subsystem 800 corresponding to the xlrom function. The subsystem 800 includes a ROM 802, a ROM 804, a ROM 806, an adder 808, and a multiplexer 810. The ROMs 802, 804, and 806 each include an ADDR port and a Q port. The multiplexer 810 includes data ports D0 and D1 and a selection port SEL. The adder 808 includes an A port and a B port and is configured to add the signal at the A port to the signal at the B port (A+B).

The SEL port of the multiplexer 810 receives a signal associated with the variable adr_sel. The D0 and D1 ports of the multiplexer 810 receive signals associated with the addr1 and addr2 variables, respectively. The A port of the adder 808 receives the signal associated with the addr1 variable, and the B port of the adder 808 receives the signal associated with the offset variable. The ADDR port of the ROM 802 is coupled to output of the multiplexer 810 and the Q port provides a signal associated with the q1 variable. The ADDR port of the ROM 804 is coupled to output of the adder 808 and the Q port provides signals associated with the q2 variable and the q3 variable. The ADDR port of the ROM 806 is receives the signal associated with the addr2 variable and the Q port provides a signal associated with the q4 variable. Notably, the vector state object obj1 is mapped to the ROM 802, which is a zero latency ROM. The vector state object obj2 is mapped to the ROM 804, which is also a zero latency ROM. The vector state object obj3 is mapped to the ROM 806, which is a one latency ROM. Note that the scalar state object reg is implemented together with the vector state object obj3 as the one latency ROM 806, since the scalar state object reg is mappable to the Q port of a memory.

Another example considers a single-port RAM. The single-port RAM includes one D port and one Q port, a CLK port, and ADDR port, and a write-enable (WE) port. The CLK port is tied with the clock of the subsystem. A vector state object can be mapped to a single-port RAM in hardware if the object usage meets the following criteria:

(1) The only operations for that object are obj(addr) and obj(addr)=d;
(2) At most one obj(addr) and at most one obj(addr)=d are called during a cycle with the same address;
(3) If the call to obj(addr) feeds only to a scalar state object, the vector state object together with the scalar state object will be mapped to a single port RAM with synchronous read;
(4) If the scalar state object gets assigned with obj(addr) after the call to obj(addr)=d during the same cycle, the RAM is to have read-after-write mode;
(5) If the scalar state object gets assigned with obj(addr) before the call to obj(addr)=d during the same cycle, the RAM is to have write-after-read mode;
(6) If the scalar state object gets assigned with obj(addr) only for the cycle that there is no call to obj(addr)=d, the RAM is to have no-read-on-write mode.
(7) If the call to obj(addr) feeds to another combinatorial path, the vector state object will be mapped to a single port RAM with asynchronous read;
(8) The usage can be categorized into exactly one of the four usages given in the rules (4), (5), (6), and (7) above.

Figure 9:
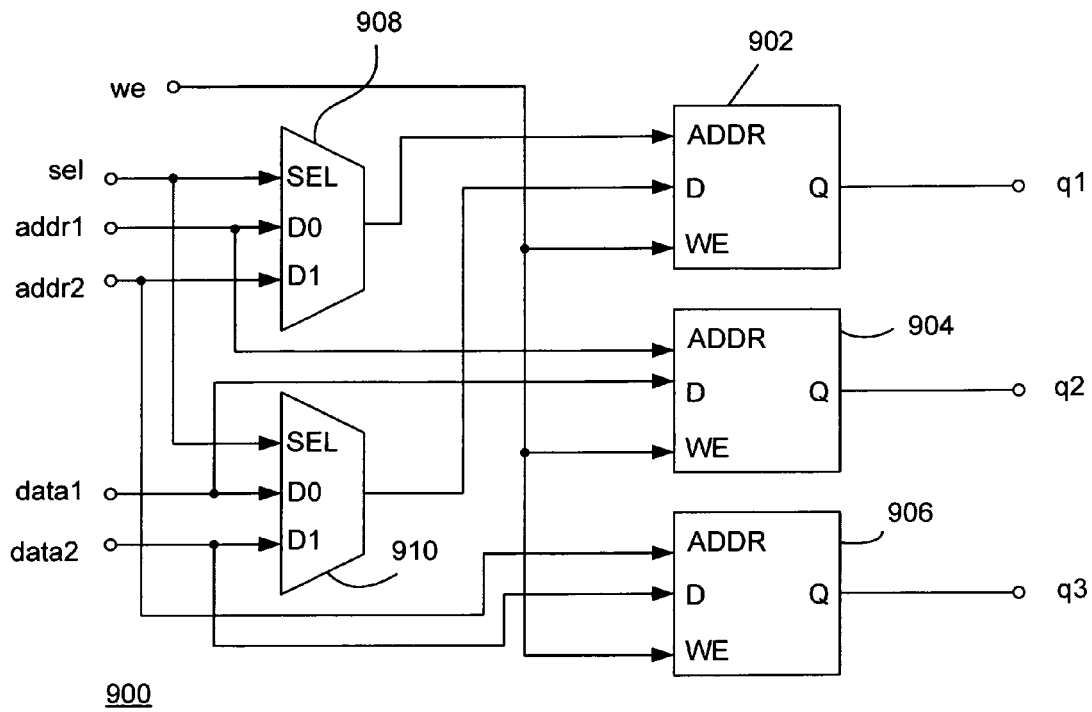

In the following function, the vector state object obj1 can be mapped to a RAM with read-after-write mode, the vector state object obj2 can be mapped to a RAM with write-after-read mode, and the vector state object obj3 can be mapped to a RAM with no-read-on-write mode, since their usage meets the above criteria:

function [q1, q2, q3]=xlram (we, sel, addr1, addr2, data1, data2)
persistent obj1; obj1=xl_state([1,2,3,4], {xlSigned, 8, 4}, 4);
persistent obj2; obj2=xl_state([1,3,5,7], {xlSigned, 8, 4}, 4);
persistent obj3; obj3=xl_state([2,4,6,8], {xlSigned, 8, 4}, 4);
persistent reg1; reg1=xl_state(0, {xlSigned, 8, 4});
persistent reg2; reg2=xl_state(0, {xlSigned, 8, 4});
persistent reg3; reg3=xl_state(0, {xlSigned, 8, 4});
q1=reg1;
q2=reg2;
q3=reg3;
if we
    if sel==0
        obj1(addr1)=data1;
    else
        obj1 (addr2)=data2;
    end
end
if sel==0
    reg1=obj1(addr1);
else
    reg1=obj1(addr2);
end
reg2=obj2(addr1);
if we
    obj2(addr1)=data1;
end
if we
    obj3(addr2)=data2;
else
    reg3=obj3(addr2);
end FIG. 9 is a block diagram illustrating a subsystem 900 corresponding to the xlram function. The subsystem 900 includes a RAM 902, a RAM 904, a RAM 906, a multiplexer 908, and a multiplexer 910. Each of the multiplexers 908 and 910 include a selection port SEL, and data input ports D0 and D1. Each of the RAMs 902, 904, and 906 includes an ADDR port, a D port, a WE port, and a 0 port. The SEL port of the multiplexer 908 receives a signal associated with the sel variable. The D0 and D1 ports of the multiplexer 908 receive signals associated with the addr1 and addr1 variables. The SEL port of the multiplexer 910 receives the signal associated with the variable sel. The D0 and D1 ports of the multiplexer 910 receive signals associated with the data1 and data2 variables. The ADDR port of the RAM 902 is coupled to the output of the multiplexer 908, and the D port of the RAM 902 is coupled to the output of the multiplexer 910. The ADDR port of the RAM 904 receives the signal associated with the addr1 variable, and the D port of the RAM 904 receives the signal associated with the data1 variable. The ADDR port of the RAM 906 receives the signal associated with the addr2 variable, and the D port of the RAM 906 receives the signal associated with the data2 variable. The WE port of each of the RAMs 902, 904, and 906 receives the signal associated with the variable we. Notably, the vector state object obj1 is mapped to the RAM 902, which is in the read-after-write mode. The vector state object obj2 is mapped to the RAM 904, which is in the write-after-read mode. The vector state object obj3 is mapped to the RAM 906, which is in the no-read-on-write mode. Note that the scalar state objects reg1, reg2, and reg3 are implemented together with the vector state objects obj1, obj2, and obj3, respectively.

Another example considers a dual-port RAM. The dual port RAM has two independent sets of ports for simultaneous reading and writing. Independent address, data, and write enables ports allow for shared access to a single memory space. Each port set has one output port (A/B), and three input ports for address (addrA/addrB), input data (dataA/dataB), and write enable (weA/weB). A vector state object can be mapped to dual-port RAM in hardware if the object usage meets the following criteria:

(1) The only operations for that object are obj(addr) and obj(addr)=d;

(2) There are at most two obj(addr) and at most one obj (addr)=d operations during a cycle with the same address;

(3) The two obj(addr) calls must feed only two scalar state objects separately, the vector object together with the state objects will be mapped to a dual port RAM;

(4) If one of the scalar state objects gets assigned with obj(addr) after the call to obj(addr)=d during the same cycle, the RAM port set is to have read-after-write mode;

(5) If one of the scalar state objects gets assigned with obj(addr) before the call to obj(addr)=d during the same cycle, the RAM port set is to have write-after-read mode;

(6) If one of the scalar state objects gets assigned with obj(addr) only for the cycle that there is no call to obj (addr)=d, the RAM port set is to have no-read-on-write mode.

(7) If there is at most one obj(addr) call for a cycle, a port set of the RAM is mapped to write-only.

(8) If there is at most one obj(addr)=data call for a cycle, a port set of the RAM is mapped to read-only.

The initial value for the vector state object is the initial value for the RAM. When there is a obj(addr)=d call, the addr port of a RAM port set is set to addr and the we port of the RAM port set is set to logic high (active). The scalar state object is the data port of one of the RAM port sets. The initial value of the scalar state object is the initial value of the data out port of the RAM port set. In the following function, obj1 is mapped into a dual-port RAM. The port set A has write-after-read mode and the port set B has no-read-on-write mode:

```
function [A1, B1, A2, B2]=xldpram (weA1, addrA1,
    dataA, weB1, addrB, dataB, we2)
    persistent obj1; obj1=xl_state ([1,2,3,4], {xlSigned, 8,
        4}, 4);
    persistent reg1A; reg1A=xl_state (0, {xlSigned, 8, 4});
    persistent reg1B; reg1B=xl_state (0, {xlSigned, 8, 4});
    persistent obj2; obj2=xl_state ([1,2,3,4], {xlSigned, 8,
        4}, 4);
    persistent reg2A; reg2A=xl_state (0, {xlSigned, 8, 4});
    persistent reg2B; reg2B=xl_state (0, {xlSigned, 8, 4});
    A1=reg1A;
    B1=reg1B;
    A2=reg2A;
    B2=reg2B;
    reg1A=obj1(addrA1);
    if weA1
        obj1(addrA1)=dataA;
    end
    if weB1
        obj1(addrB)=dataB;
    else
        reg1B=obj1 (addrB);
    end
    if we2
        obj2(addrA1)=dataA;
    end
    reg2A=obj2(addrA);
    reg2B=obj2(addrB);
```

Figure 10:
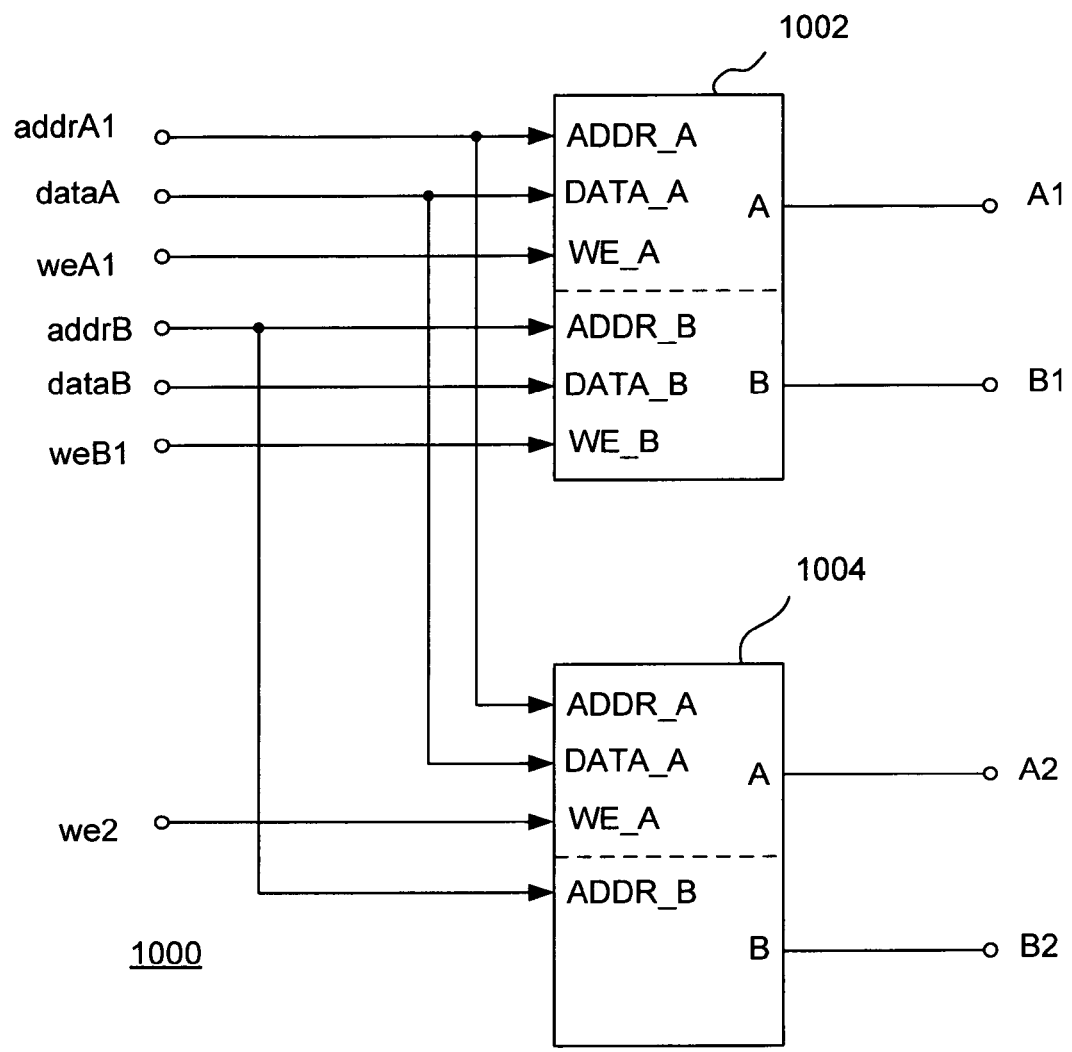

FIG. 10 is a block diagram illustrating a subsystem 1000 corresponding to the xldpram function. The subsystem 1000 comprises a dual port RAM 1002 and a dual port RAM 1004. The dual port RAM 1002 includes an addrA port, a dataA port, a weA port, an addrB port, a dataB port, a weB port, and A port, and a B port. The dual port RAM 1004 includes an addrA port, a dataA port, a weA port, an addrB port, an A port, and a B port. A signal associated with the weA1 variable is coupled to the weA port the dual port RAM 1002. A signal associated with the we2 variable is coupled to the weA port of the dual port RAM 1004. A signal associated with the addrA1 variable is coupled to the addrA port of each of the dual port RAMs 1002 and 1004. A signal associated with the dataA variable is coupled to the dataA ports of the RAMs 1002 and 1004. A signal associated with the weB1 variable is coupled to the weB port of the RAM 1002. A signal associated with the addrB variable is coupled to the addrB ports of the RAMs 1002 and 1004. A signal associated with the dataB variable is coupled to the dataB port of the RAM 1002. The A and B ports of the RAM 1002 provide the A1 and B1 signals, respectively. The A and B ports of the RAM 1004 provide the signals A2 and B2, respectively. Notably, the vector state object obj1 is mapped to the dual port RAM 1002, and the vector state object obj2 is mapped to the dual port RAM 1004.

A final example considers a FIFO. If a function uses obj.push_front(d), obj.back( ), and obj.pop_back( ), and the obj.back( ) is feeding a scalar state object, the object is used in a FIFO fashion. The vector state object is mapped together with the scalar state object to a subsystem having a dual port RAM and two registers for addressing head and back of the FIFO. A vector state object can be mapped into a dual port RAM and two registers if the usage meets the following criteria:

(1) The only operations for that object are obj.push_front (d), obj.back( ), and obj.pop_back( );

(2) The obj.back( ) calls precede all calls to obj.push_front (d) and obj.pop_back( );

(3) The obj.back( ) call is feeding a scalar state object;

(4) For any simulation cycle, at most one obj.push_front(d) and at most one obj.pop_back( ) operations are called.

The following steps are applied to the mapping:

(1) Use a dual port RAM the size of which is no smaller than the maximum length of the vector state object. The A port set of the dual port RAM is write-only and the B port of the dual port RAM is read-only.

(2) The B port of the dual port RAM is the scalar state object value holding the value of the obj.back( ) call;

(3) Use a register as the head index of the vector and connect the Q port of the register to addrA of the dual port RAM;

(4) When there is an obj.push_front(d) call, set the data port of the dual port RAM to be the data to push, set the weA port of the dual port RAM to be logic high, and increment the head register;

(5) Use a register as the back index of the vector and connect the Q port of the register to addrB of the dual port RAM;

(6) When there is an obj.pop_back( ) call, increment the back register.

The following function is an example that meets the above usage criteria:

```
function [dout]=fifo(din, we, re)
    persistent S, S=xl_state([ ], din, depth);
    persistent r, r=xl_state(0, din);
    dout=r;
    if re
        r=S.back( );
        S.pop_back( );
    end
    if we
        S.push_front(din);
    end
```

Figure 11:
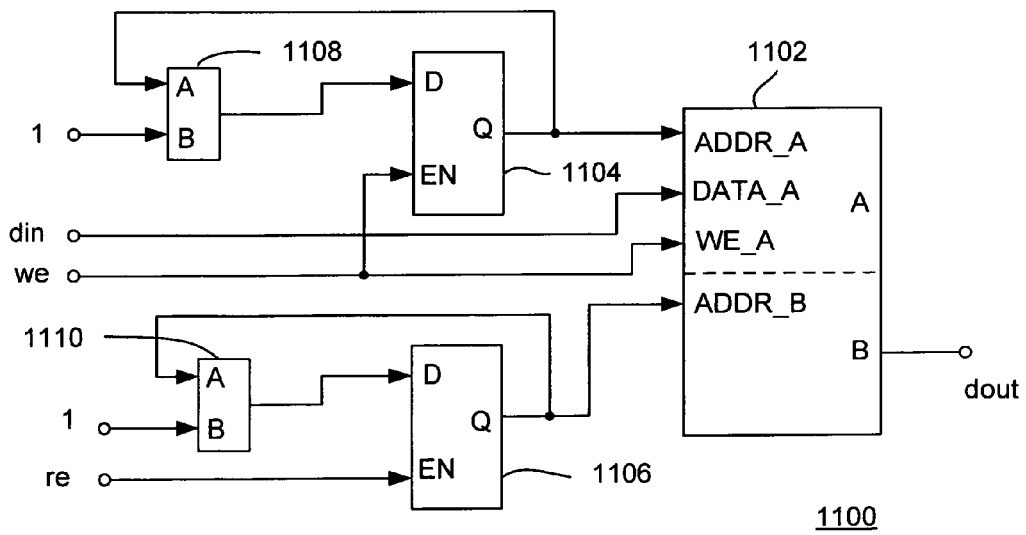

FIG. 11 is a block diagram illustrating a subsystem 1100 corresponding to the fifo function. The subsystem 1100 includes a dual port RAM 1102, a register 1104, an register 1106, an adder 1108, and an adder 1110. The dual port RAM 1102 includes an addrA port, a dataA port, a weA port, an addrB port, and a B port. The registers 1104 and 1106 each include a D port, an EN port, and a Q port. The adders 1108 and 1110 each include an A port, a B port, and are configured to add the signal at port A to the signal at port B (A+B output). The A port of the adder 1108 is coupled to the Q port of the register 1104. The B port of the adder 1108 receives a constant logic high. The D port of the register 1104 is coupled to the output of the adder 1108. The EN port of the register 1104 receives a signal associated with the we variable. The addrA port of the dual port RAM 1102 is coupled to the Q port of the register 1104. The dataA port of the dual port RAM 1102 receives a signal associated with the din variable. The weA port of the dual port RAM 1102 receives the signal associated with the we variable. The A port of the adder 1110 is coupled to the Q port of the register 1106. The B port of the adder 1110 receives a constant logic high. The D port of the register 1106 is coupled to the output of the adder 1110. The EN port of the register 1106 receives a signal associated with the variable re. The addrB port of the dual port RAM 1102 is coupled to the Q port of the register 1106. The B port of the dual port RAM 1102 provides a signal associated with the dout variable. Notably, the vector state object and the scalar state object of the function are mapped into the dual port RAM 1002, the register 1104, and the register 1106.

Figure 12:
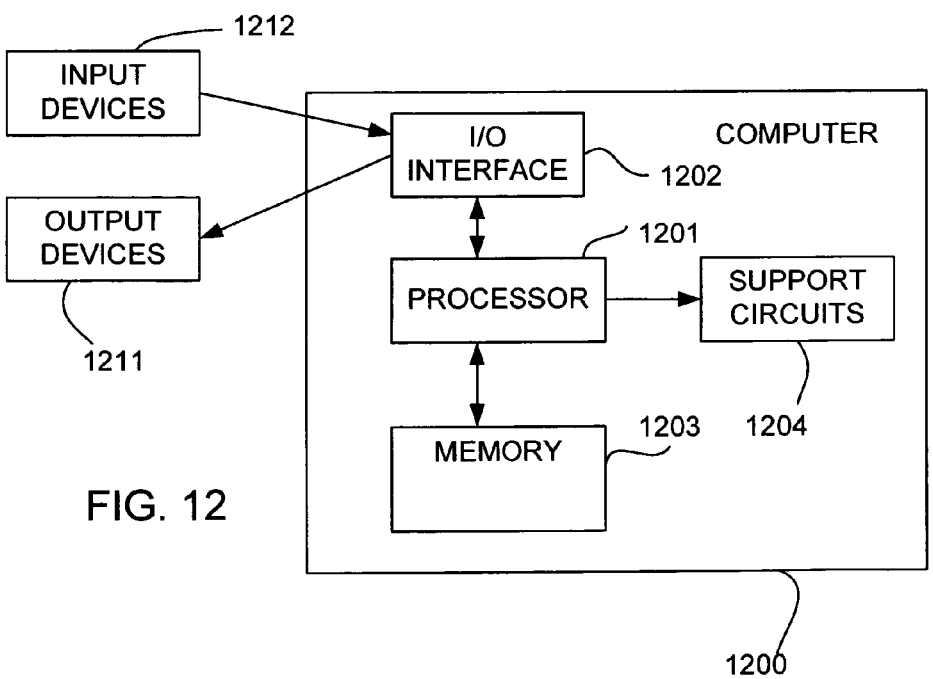
FIG. 12 is a block diagram depicting an exemplary embodiment of a computer suitable for implementing the processes and methods described herein.

FIG. 12 is a block diagram depicting an exemplary embodiment of a computer 1200 suitable for implementing the processes and methods described herein. For example, the computer 1200 may be used to implement the system 100 of FIG. 1, as well as the method 200 of FIG. 2. The computer 1200 includes a processor 1201, a memory 1203, various support circuits 1204, and an I/O interface 1202. The processor 1201 may be any type of microprocessor known in the art. The support circuits 1204 for the processor 1201 include conventional cache, power supplies, clock circuits, data registers, I/O interfaces, and the like. The I/O interface 1202 may be directly coupled to the memory 1203 or coupled through the processor 1201. The I/O interface 1202 may be coupled to various input devices 1212 and output devices 1211, such as a conventional keyboard, mouse, printer, display, and the like.

The memory 1203 stores all or portions of one or more programs and/or data to implement the system 100 and the method 200 described herein. Although one or more aspects of the invention are disclosed as being implemented as a computer executing a software program, those skilled in the art will appreciate that the invention may be implemented in hardware, software, or a combination of hardware and software. Such implementations may include a number of processors independently executing various programs and dedicated hardware, such as ASICs.

The computer 1200 may be programmed with an operating system, which may be OS/2, Java Virtual Machine, Linux, Solaris, Unix, Windows, Windows95, Windows98, Windows NT, and Windows2000, WindowsME, and WindowsXP, among other known platforms. At least a portion of an operating system may be disposed in the memory 1203. The memory 1203 may include one or more of the following random access memory, read only memory, magneto-resistive read/write memory, optical read/write memory, cache memory, magnetic read/write memory, and the like, as well as signal-bearing media as described below.

An aspect of the invention is implemented as a program product for use with a computer system. Program(s) of the program product defines functions of embodiments and can be contained on a variety of signal-bearing media, which include, but are not limited to: (i) information permanently stored on non-writable storage media (e.g., read-only memory devices within a computer such as CD-ROM or DVD-ROM disks readable by a CD-ROM drive or a DVD drive); (ii) alterable information stored on writable storage media (e.g., floppy disks within a diskette drive or hard-disk drive or read/writable CD or read/writable DVD); or (iii) information conveyed to a computer by a communications medium, such as through a computer or telephone network, including wireless communications. The latter embodiment specifically includes information downloaded from the Internet and other networks. Such signal-bearing media, when carrying computer-readable instructions that direct functions of the invention, represent embodiments of the invention.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

The invention claimed is:

1. A method of translating an imperative programming language description of a circuit into a hardware description, comprising:
    identifying a state object in a function of the imperative programming language description, the state object being persistent across executions of the function;
    comparing use of the state object in the function against criteria associated with each of a plurality of hardware objects;
    mapping the state object to a hardware object of the plurality of hardware objects such that the use of the state object in the function satisfies the criteria of the hardware object; and
    generating at least one instance of the hardware object in the hardware description.

2. The method of claim 1, wherein the state object is a scalar state object, and wherein the hardware object comprises a register.

3. The method of claim 1, wherein the state object is a vector state object, and wherein the hardware object comprises one of a shift register, a tapped shift register line, a register bank, an addressable shift register, a read only memory (ROM), a single port random access memory (RAM), a dual port RAM, and a first-in-first-out circuit (FIFO).

4. The method of claim 1, further comprising:
    identifying a vector state object in the function of the imperative programming language description mappable to a memory hardware object;
    wherein the state object is a scalar state object and wherein the hardware object comprises the memory hardware object.

5. The method of claim 1, further comprising:
    mapping at least one expression in the function to combinatorial logic; and
    generating at least one instance of the combinatorial logic in the hardware description.

6. The method of claim 5, wherein the at least one expression comprises at least one conditional statement, and wherein the at least one conditional statement is mapped to multiplexer logic in the combinatorial logic.

7. The method of claim 1, wherein the state object comprises a persistent variable or a persistent array of variables, the state object being initialized by an initialization function.

8. A method of translating an imperative programming language description of a circuit into a hardware description, comprising:
- identifying a state object in a function of the imperative programming language description, the state object being of a scalar type or a vector type and being persistent across executions of the function;
- mapping the state object to a register if the state object is of the scalar type;
- if the state object is of the vector type:
  - comparing use of the state objection in the function against criteria associated with each of a plurality of hardware objects;
  - selecting a hardware object of the plurality of hardware objects such that the use of the state object in the function satisfies the criteria of the hardware object;
  - mapping the state object to the hardware object; and
- generating at least one instance of the register or at least one instance of the hardware object in the hardware description.

9. The method of claim 8, further comprising:
- mapping at least one expression in the function to combinatorial logic; and
- generating at least one instance of the combinatorial logic in the hardware description.

10. The method of claim 9, wherein the at least one statement comprises at least one conditional statement, and wherein the at least one conditional statement is mapped to multiplexer logic in the combinatorial logic.

11. The method of claim 8, wherein the state object comprises a persistent variable initialized by an initialization function if the state object is of the scalar type, and a persistent variable array initialized by the initialization function if the state object is of the vector type.

12. The method of claim 8, wherein the step of mapping the state object to the register comprises:
- mapping a value of the state object as initially assigned in the function to a data output port of the register; and
- mapping the value of the state object as finally assigned in the function to a data input port of the register.

13. The method of claim 8, wherein the plurality of hardware objects comprise a shift register, a tapped shift register line, a register bank, an addressable shift register, a read only memory (ROM), a single port random access memory (RAM), a dual port RAM, and a first-in-first-out circuit (FIFO).

14. The method of claim 8, wherein the state object is mapped to the register in the hardware description if the state object is of the scalar type and if the state object is not mappable to a port of a memory hardware object to which another state object in the function of the imperative programming language description is mappable.

15. A circuit design system, comprising:
- a programming environment for providing an imperative programming language description of a circuit; and
- a translator configured to:
  - identify a state object in a function of the imperative programming language description, the state object being persistent across executions of the function;
  - compare use of the state object in the function against criteria associated with each of a plurality of hardware objects;
  - map the state object to a hardware object of the plurality of hardware objects such that the use of the state object in the function satisfies the criteria of the hardware object; and
  - generate at least one instance of the hardware object in the hardware description.

16. The system of claim 15, wherein the state object is a scalar state object, and wherein the hardware object comprises a register.

17. The system of claim 15, wherein the state object is a vector state object, and wherein the hardware object comprises one of a shift register, a tapped shift register line, a register bank, an addressable shift register, a read only memory (ROM), a single port random access memory (RAM), a dual port RAM, and a first-in-first-out circuit (FIFO).

18. The system of claim 15, wherein the translator is further configured to:
- identify a vector state object in the function of the imperative programming language description mappable to a memory hardware object;
- wherein the state object is a scalar state object and wherein the hardware object comprises the memory hardware object.

19. The system of claim 15, wherein the translator is further configured to:
- map at least one expression in the function to combinatorial logic; and
- generate at least one instance of the combinatorial logic in the hardware description.

20. The system of claim 15, wherein the state object comprises a persistent variable or a persistent array of variables, the state object being initialized by an initialization function.

* * * * *